(12) United States Patent
Satoh et al.

(10) Patent No.: US 6,911,890 B2
(45) Date of Patent: Jun. 28, 2005

(54) HIGH FREQUENCY LAMINATED DEVICE

(75) Inventors: Yuki Satoh, Osaka (JP); Tsutomu Inuzuka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/648,061

(22) Filed: Aug. 26, 2003

(65) Prior Publication Data

US 2004/0075968 A1 Apr. 22, 2004

(30) Foreign Application Priority Data

Aug. 30, 2002 (JP) .................................. 2002-254352

(51) Int. Cl.[7] .................................................. H01F 5/00
(52) U.S. Cl. ........................................ 336/200; 336/83
(58) Field of Search ...................... 336/83, 200, 205–208, 336/232; 257/531; 361/320, 321.1–321.3

(56) References Cited

U.S. PATENT DOCUMENTS 6,426,551 B1 * 7/2002 Kawakami et al. ......... 257/700
6,498,553 B1 * 12/2002 Tanaka et al. ............... 336/83

FOREIGN PATENT DOCUMENTS

JP            02-232915      *  9/1990

* cited by examiner

Primary Examiner—Tuyen T Nguyen
(74) Attorney, Agent, or Firm—RatnerPrestia (57) ABSTRACT

A laminated high frequency device includes a laminated body including plural magnetic sheets having relative permeabilities larger than 1, inductor patterns for forming plural inductors in the laminated body, and capacitor patterns forming a capacitor. The capacitor patterns are opposed to each other about another sheet of the laminated body. The inductors have large inductances without thickening of the magnetic sheet or thinning of the inductor patterns providing a large conductor loss. This arrangement reduces a size of the laminated high frequency device while providing isolation between the inductors.

6 Claims, 10 Drawing Sheets

HIGH FREQUENCY LAMINATED DEVICE

FIELD OF THE INVENTION

The present invention relates to a high frequency laminated device used in mobile communication equipment, such as portable phones.

BACKGROUND OF THE INVENTION

Figure 12:
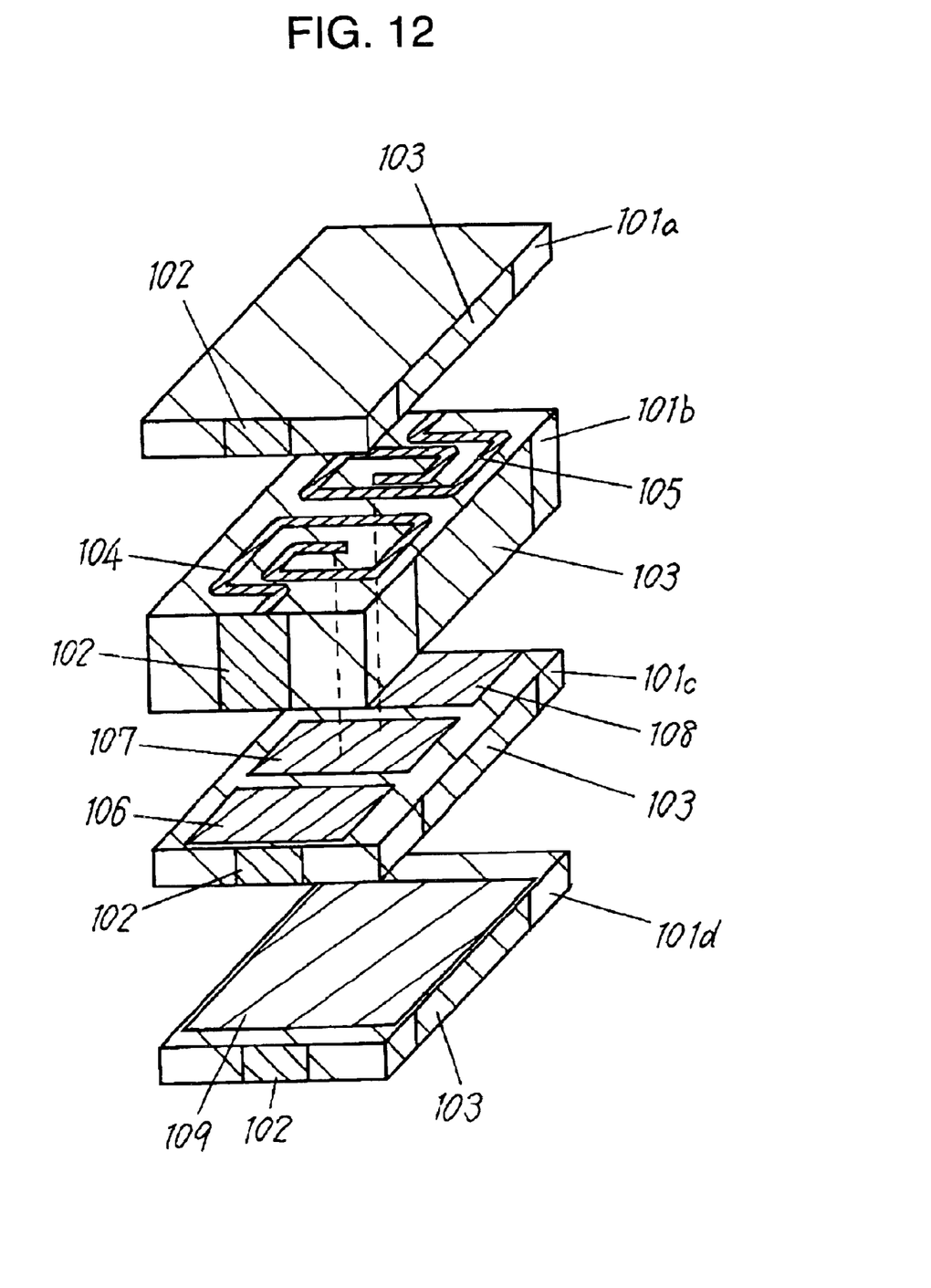
FIG. 12 is an exploded perspective view of a conventional high frequency laminated device.
Figure 13:
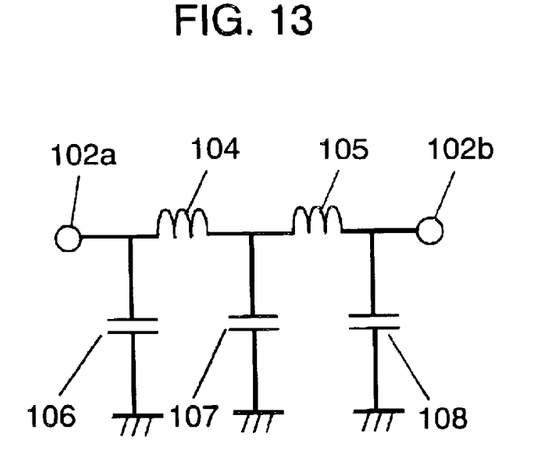
FIG. 13 is an equivalent circuit diagram of the conventional high frequency laminated device.

Electronic components used in mobile communication equipment, such as portable phones are required to have a small size and a small weight without having their performance decline. A transmission circuit of the mobile communication equipment includes a low pass filter for preventing emission of unnecessary signals, such as higher harmonics. FIG. 12 shows a laminated low pass filter (LPF) as a conventional high frequency laminated device. The LPF includes sheets 101a to 101d, input/output terminal 102, ground (GND) terminal 103, inductors 104 and 105 printed as electrode patterns on the sheet 101b, capacitors 106, 107, and 108 printed as electrode patterns on the sheet 101c, and GND pattern 109 printed as an electrode pattern on the sheet 101d. FIG. 13 shows an equivalent circuit of the LPF.

Figure 14:
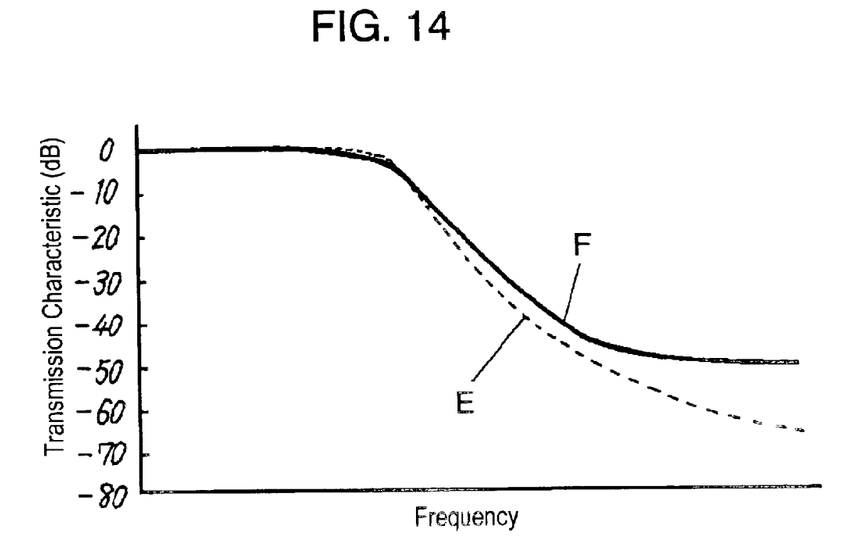
FIG. 14 is a characteristic diagram of the conventional high frequency laminated device.

In the LPF, the printed electrode patterns are located as close to each other as possible in order to allow the device to have a reduced size. The LPF, having an excessively reduced size, as shown by solid line F of FIG. 14, does not suppress high frequency bands sufficiently. This is caused due to mutual magnetic interference particularly between the inductors 104 and 105. Dotted line E shows an ideal characteristic of the LPF without the mutual magnetic interference.

In order to allow the LPF to have the small size, a space between the electrode patterns of inductors 104 and 105 adjacent to each other is narrow. But, the narrow space has the LPF have a declining performance as the characteristic shown in FIG. 14.

An inductance (L) at a frequency ($\omega$) of an inductor formed of an electrode pattern having a characteristic impedance (Z) and an electrical length ($\theta$) is expressed as the following equation:

$$L = (Z \cdot \sin\theta)/\omega \quad \text{(Equation 1)}$$

In order to reduce an area occupied by the electrode pattern while the inductance (L) is maintained in constant, the characteristic impedance (Z) is increased, and the electrical length ($\theta$) is accordingly reduced. That is, the area occupied by the electrode pattern is reduced by making the electrical length ($\theta$) smaller to make the electrode pattern shorter.

However, since the sheet 101a to 101d have certain dielectric constants, the sheets 101a to 101d need to be thick, or the electrode pattern need to be thin in order to increase the characteristic impedance (Z). The thick sheets 101a to 101d would be contrary to the small size of the LPF. Moreover, thinning of electrode patterns available at present, which have widths of 100 $\mu$m, decreases an electrical conductivity of electrode patterns and increases an insertion loss of the LPF. Further, it is difficult to mass-produce the thin electrode patterns because of problems, such as scratch in printing. Accordingly, it is difficult to reduce the size of the conventional LPF, a high frequency device having the laminate structure.

SUMMARY OF THE INVENTION

A high frequency laminated device includes a laminated body including a first sheet having a relative permeability larger than 1, a second sheet having a relative permeability larger than 1 provided on a first surface of the first sheet, and a third sheet provided over a second surface of the first sheet. The device further includes a first inductor pattern forming a first inductor provided between the first sheet and the second sheet, and first and second capacitor patterns forming a capacitor which are opposed to each other about the third sheet.

The inductor pattern is short, and the inductor has a large inductance and a small size, thus allowing the high frequency laminated device to have a small size.

DESCRIPTION OF THE PREFERRED EMBODIMENT (Exemplary Embodiment 1)

Figure 1:
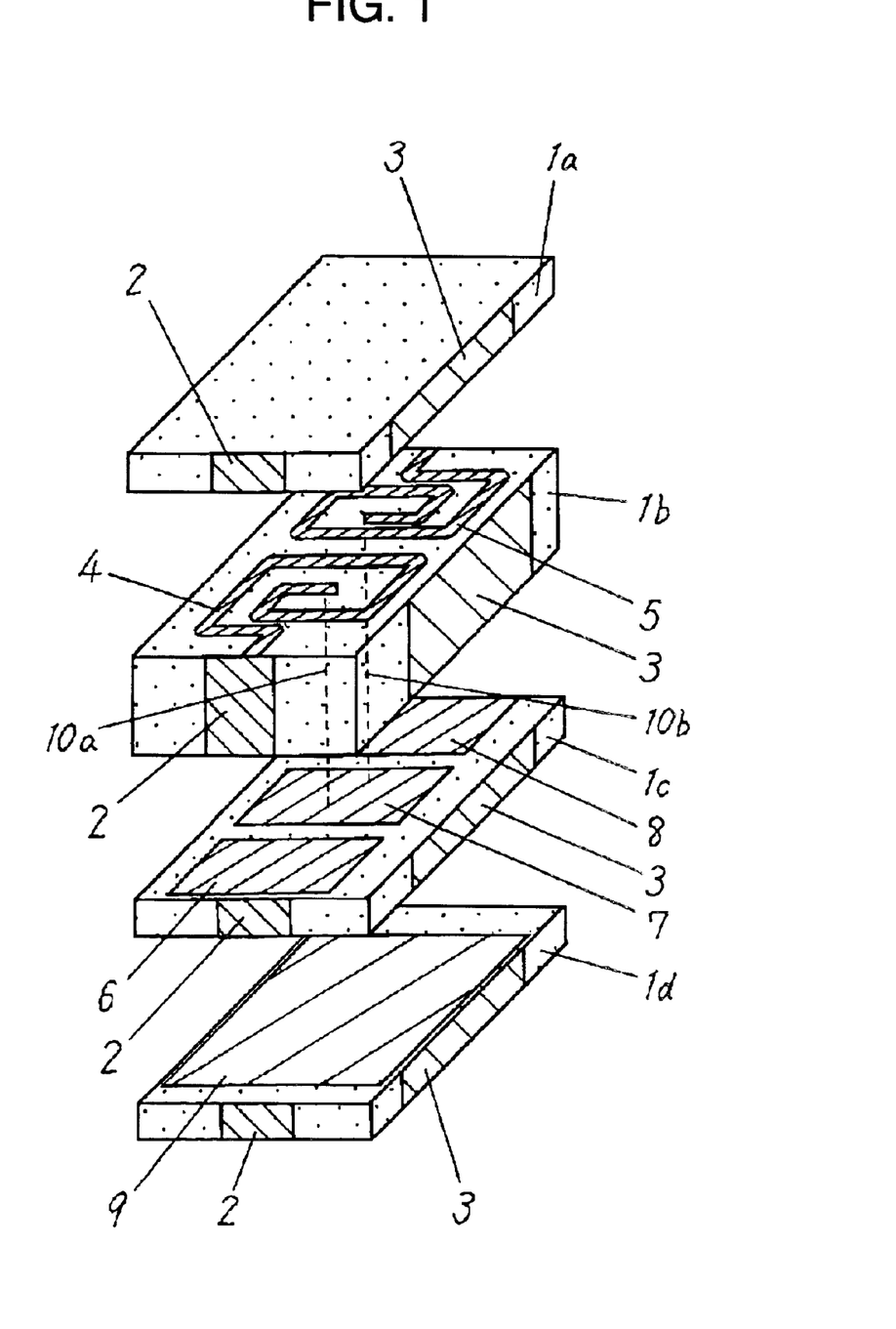
FIG. 1 is an exploded perspective view of a high frequency laminated device according to Exemplary Embodiment 1 of the present invention.

A laminated low pass filter (LPF) as a high frequency laminated device according to Exemplary Embodiment 1 of the present invention is shown in FIG. 1. The LPF includes magnetic sheets 1a to 1d made of magnetic material having a relative permeability larger than 1, input/output electrodes 2 formed on respective side surfaces of the magnetic sheets 1a to 1d, ground (GND) electrodes 3 formed similarly to the input/output electrodes 2, inductor patterns 4 and 5 for forming an inductor printed on the magnetic sheet 1b, capacitor patterns 6, 7 and 8 for forming capacitors printed on the magnetic sheet 1c, GND pattern 9 printed on the magnetic sheet 1d, and via-conductors 10a and 10b.

The magnetic sheets 1a to 1d are stacked in an order shown in the figure and are sintered unitarily to provide a laminated body. The ends of the input/output electrodes 2 and inductance patterns 4 are electrically connected to a portion of the capacitor pattern 6, and the GND electrode 3 is electrically connected to the GND pattern 9. The capacitor patterns 6, 7 and 8 are opposed to the GND pattern 9 about the magnetic sheet 1c.

The other ends of the inductor patterns 4 and 5 are electrically connected to the capacitor pattern 7 through the via-conductors 10a and 10b, respectively. Another input/output terminal (not shown) is formed on a side surface opposite to the side surface where the input/output terminal 2 is formed, and another GND electrode (not shown) is formed on a side surface opposite to a side surface where the GND electrode 3 is formed.

Figure 2:
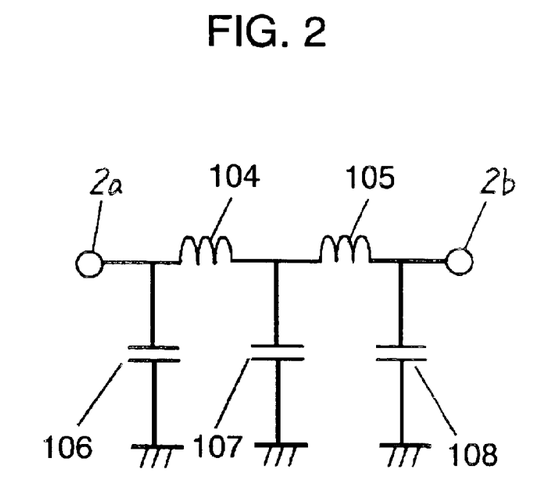
FIG. 2 is an equivalent circuit diagram of the high frequency laminated device of Embodiment 1.

FIG. 2 shows an equivalent circuit of the laminated LPF shown in FIG. 1. In FIG. 2, the input terminal 2a and the output terminal 2b correspond to the input/output terminal 2 shown in FIG. 1. Inductors 104 and 105 correspond to patterns 4 and 5 shown in FIG. 1, respectively. Capacitors 106, 107 and 108 correspond to patterns 6, 7, and 8 shown in FIG. 1, respectively.

Figure 3:
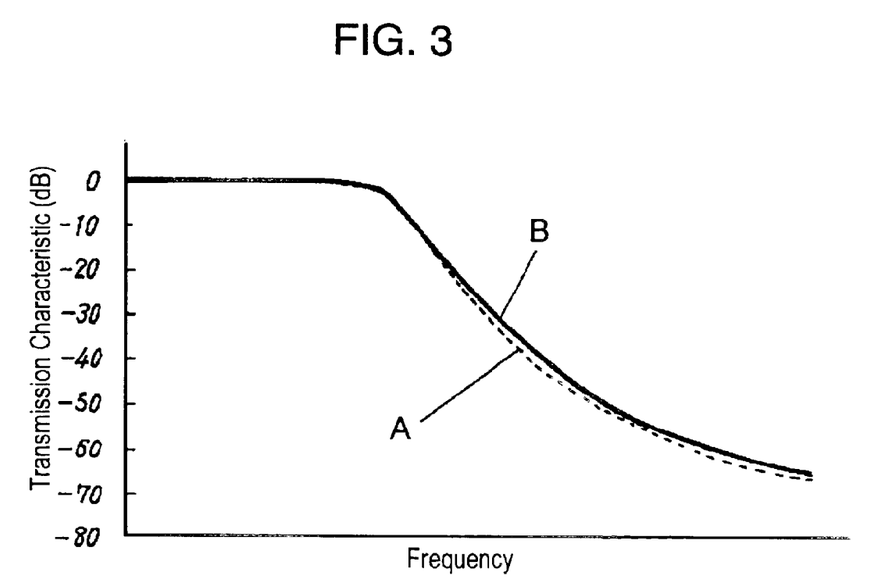
FIG. 3 is a characteristic chart of the high frequency laminated device of Embodiment 1.

FIG. 3 shows a characteristic of the laminated LPF shown in FIG. 1. A characteristic of an ideal LPF without an mutual interference between inductor 4 and inductor 5 is shown by dotted line A. The characteristic of the LPF of Embodiment 1 of the invention is shown by solid line B, which is close to the characteristic of the ideal LPF.

Figure 4:
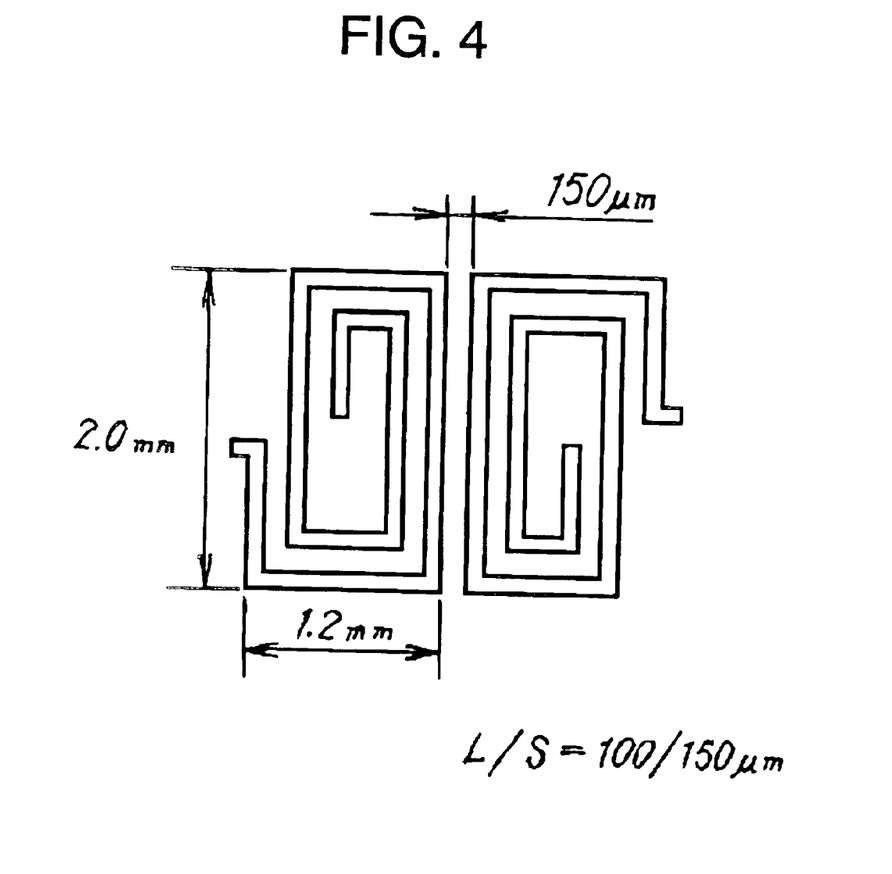
FIG. 4 is a top view of an inductor pattern of the device of Embodiment 1.
Figure 5A:
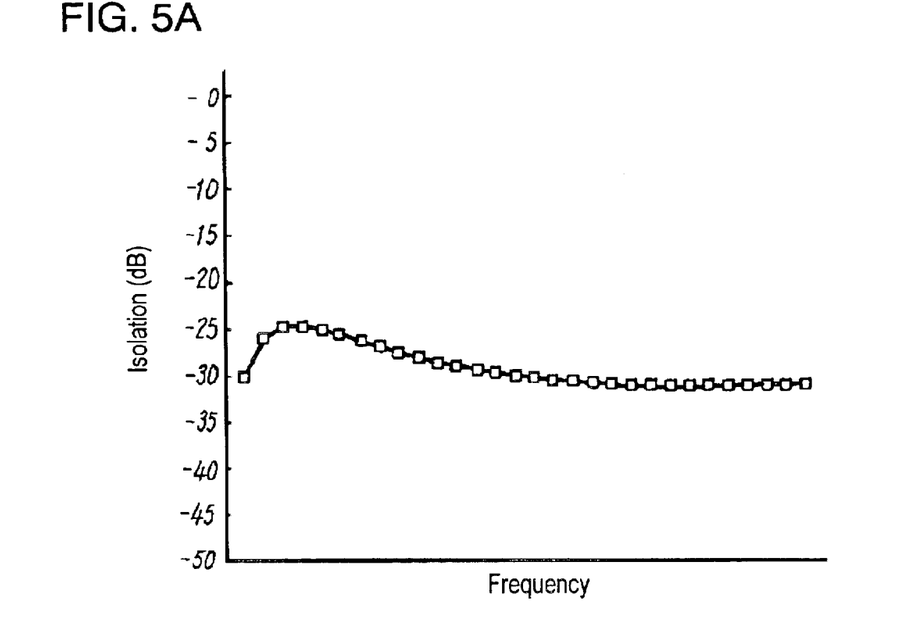
FIGS. 5A and 5B are characteristic charts of the device shown in FIG. 4.
Figure 5B:
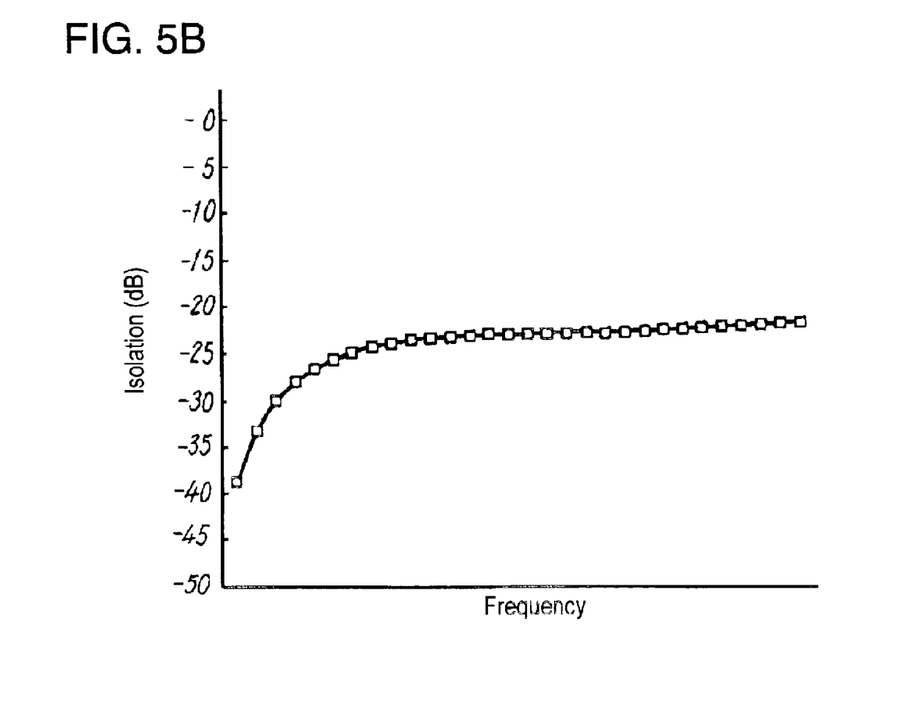

FIG. 4 shows a laminated body including only the inductor patterns 4 and 5 of inductors 104 and 105 printed on the body. FIG. 5A shows an isolation between the inductors 104 and 105 shown in FIG. 4, which are formed on a laminated body made of magnetic material ($\mu r=3$). FIG. 5B shows an isolation between the inductors 104 and 105 shown in FIG. 4, which are formed on a laminated body made of dielectric material ($\in r=3$).

As shown in FIGS. 5A and 5B, the laminated body made of the magnetic material allows the isolation between the inductors 104 and 105 to be improved by about 10 dB. The magnetic material decreases a mutual electromagnetic effect between the inductors 104 and 105. That is, the laminated body including the magnetic sheets having relative permeabilities larger than 1 reduces the mutual interference between the inductors included in the body, and provides an LPF having the ideal characteristic even if the LPF includes the inductor patterns for forming the inductor close to each other.

According to Embodiment 1, the laminated body including the magnetic sheets allows the inductor patterns 4 and 5 to have a large characteristic impedance as a transmission line, thus enabling the inductor pattern to be short. A characteristic impedance Zm of a microstrip transmission line formed on a substrate having a relative permeability $\mu r$ and a relative dielectric constant $\in r$ is generally proportional to a square root of ($\mu r/\in r$). Accordingly, the LPF of Embodiment 1 including the laminated body having the magnetic sheets of the large relative permeability $\mu r$ allows the characteristic impedance of the inductor patterns to be increased without reducing the width of the inductor pattern. As a result, the pattern can be shortened, as shown by Equation 1. That is, since the inductor pattern can be thick and short, a resistance loss in the pattern can be reduced. Thus, an LPF having a high Q value and a small loss is provided.

(Exemplary Embodiment 2)

Figure 6:
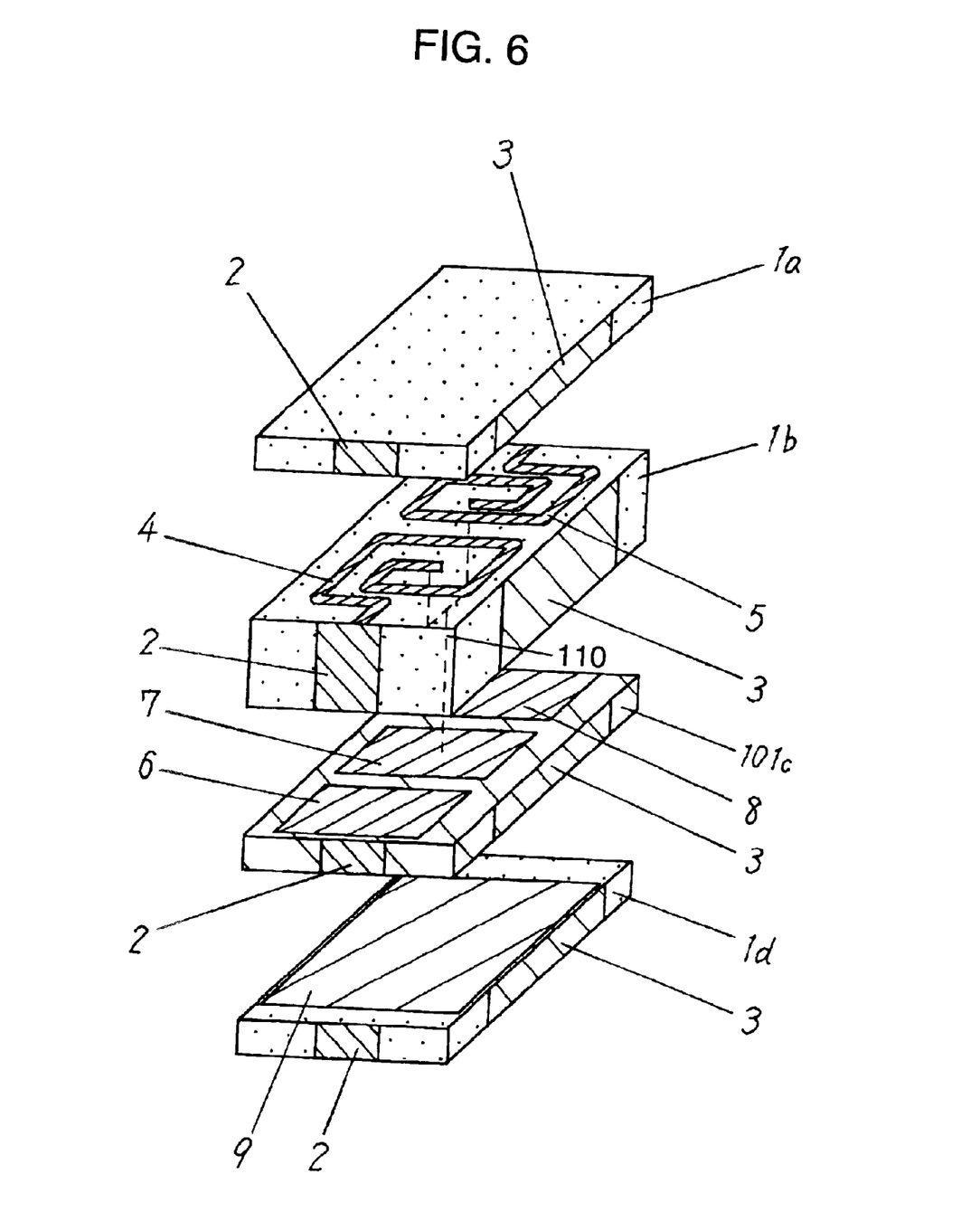
FIG. 6 is an exploded perspective view of a high frequency laminated device according to Exemplary Embodiment 2 of the invention.

FIG. 6 shows a low pass filter (LPF) as a high frequency laminated device according to Exemplary Embodiment 2 of the invention. The same elements as of an LPF of Embodiment 1 shown in FIG. 1 are denoted by the same reference numerals. The LPF of Embodiment 2, differently from the LPF of Embodiment 1 shown in FIG. 1, includes dielectric sheet 101c instead of magnetic sheet 1c. The other components are basically identical to those of Embodiment 1.

Capacitor pattern 9 is opposed to capacitor patterns 6, 7, and 8 about the dielectric sheet 101c. This arrangement allows a thickness and a relative dielectric constant of the dielectric sheet 101c to be optimized independently from other sheets, thereby reducing, for example, variations in manufacture of capacitors 6, 7 and 8. That is, a magnetic sheet is used at a portion where an inductor pattern is formed, while the dielectric sheet is used at the portion where the capacitor pattern is formed. This allows the LPF, i.e., the high frequency laminated device, to have an excellent characteristic.

In the LPF of Embodiment 2, magnetic sheet 1b and dielectric sheet 101c having patterns 6, 7, and 8 are stacked and sintered to provide a laminated body. If respective materials of the dielectric sheet and the magnetic sheet diffuse into each other during the sintering, the sheets may change in their electrical and mechanical properties, i.e., dielectric constant and permeability, increase of material loss, and deterioration of mechanical strength. The diffusion prevents reliable high frequency laminated devices from being manufactured. In the LPF of Embodiment 2, capacitor patterns 6, 7, and 8 each having a large plane are formed at an interface between the magnetic sheet 1b and the dielectric sheet 101c which form the laminated body suppress the diffusion at the interface between the magnetic sheet 1b and the dielectric sheet 101c. That is, in the LPF of Embodiment 2, capacitor patterns having large areas are formed at the interface between different materials, i.e., magnetic sheet 1b and dielectric sheet 101c. This arrangement configures a capacitor in the laminated body and provides the reliable LPF, i.e., the high frequency laminated device.

According to Embodiment 2, the capacitor pattern is formed between the dielectric sheet 101c and the magnetic sheet 1b. However, a land-form pattern having no electrical connections may provide the same effects. An inductor pattern may be formed at a portion of the interface.

According to Embodiment 2, via-conductor 110 for connecting the inductor patterns 4 and 5 to the inductor patterns 6, 7 and 8 is formed in the magnetic sheet 1b. A parasitic inductance of the via-conductor attenuates high frequency bands, thus providing the LPF with a high performance.

Figure 7:
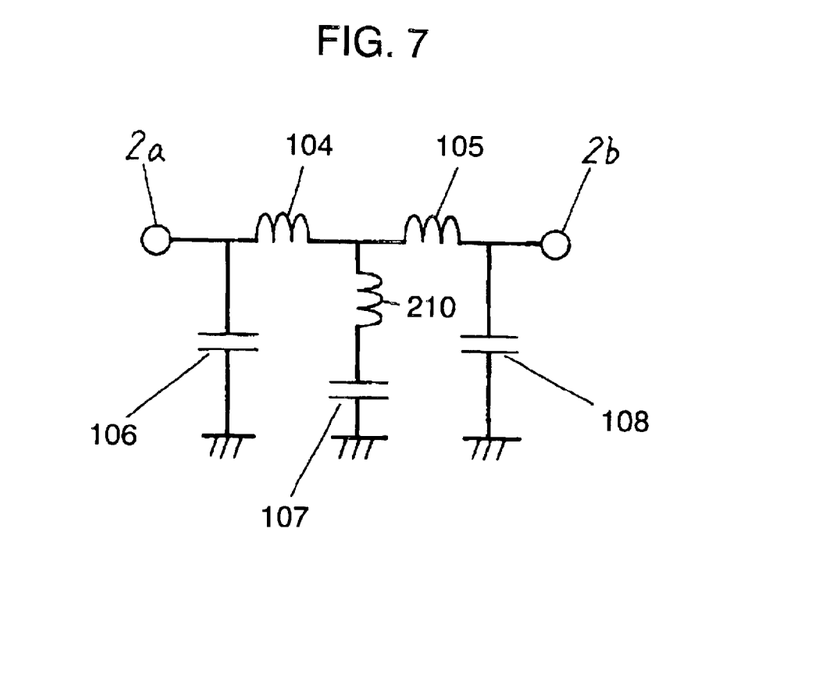
FIG. 7 is an equivalent circuit diagram of the high frequency laminated device of Embodiment 2.
Figure 8:
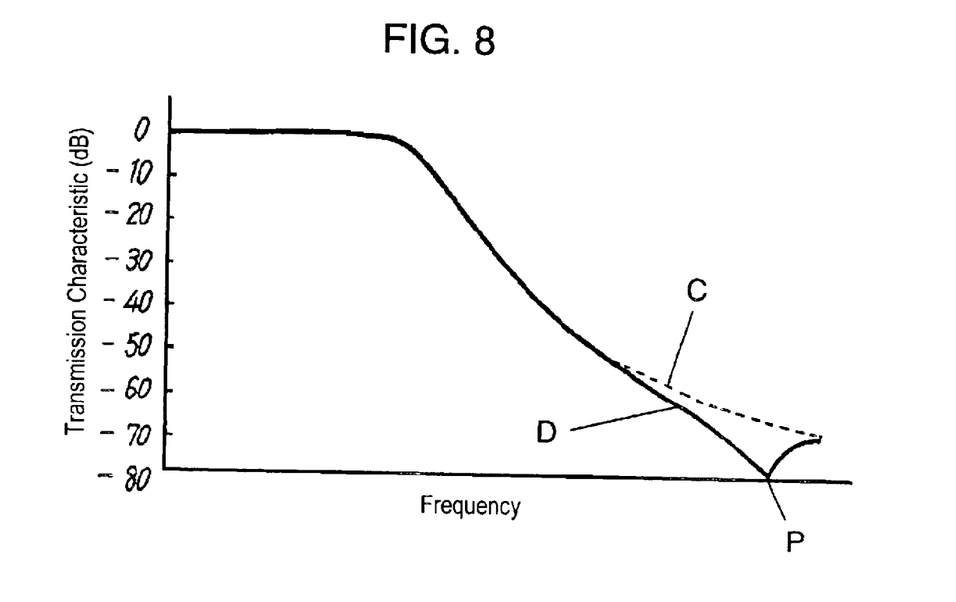
FIG. 8 is a characteristic chart of the high frequency laminated device of Embodiment 2.

FIG. 7 shows an equivalent circuit of the LPF under consideration of high frequencies. Inductor 210 introduced by the via-conductor 110 and capacitor 107 forms a series resonance circuit. The circuit provides a characteristic of the LPF shown in FIG. 8 with an attenuation pole 9. The via-conductor 110 formed in the magnetic sheet 1b improves the characteristic of the LPF. Particularly having a diameter of 100 $\mu$m, the via-conductor 110 having a length not smaller than 0.3 mm provides the LPF with remarkable effects for the characteristic.

In the above description, the LPF has been described as the high frequency laminated device of Embodiments 1 and 2. However, other high frequency devices, such as a band pass filter, a high pass filter, a diplexer, coupler, and a balun, including the laminated body exhibits the same effects.

(Exemplary Embodiment 3)

Figure 9:
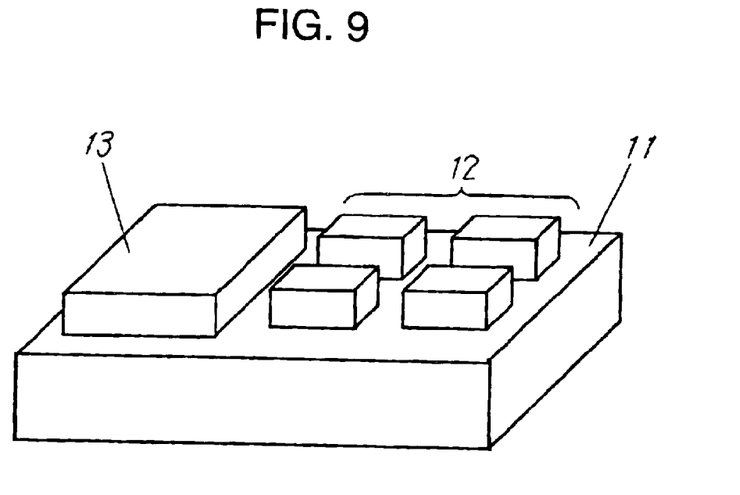
FIG. 9 is a perspective view of a high frequency laminated device according to Exemplary Embodiment 3 of the invention.
Figure 10:
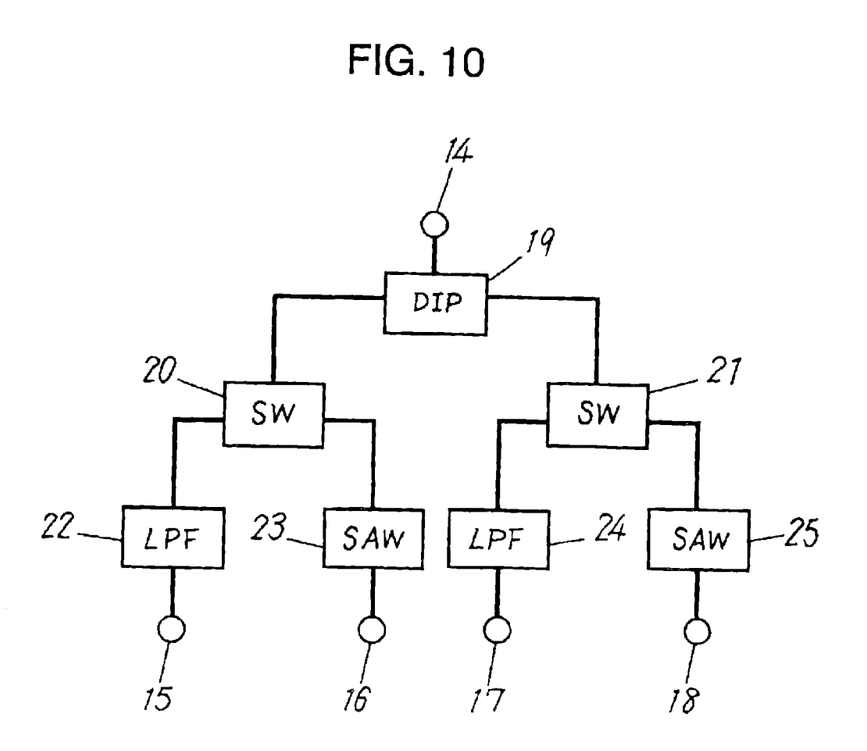
FIG. 10 is a circuit block diagram of the high frequency laminated device of Embodiment 3.
Figure 11:
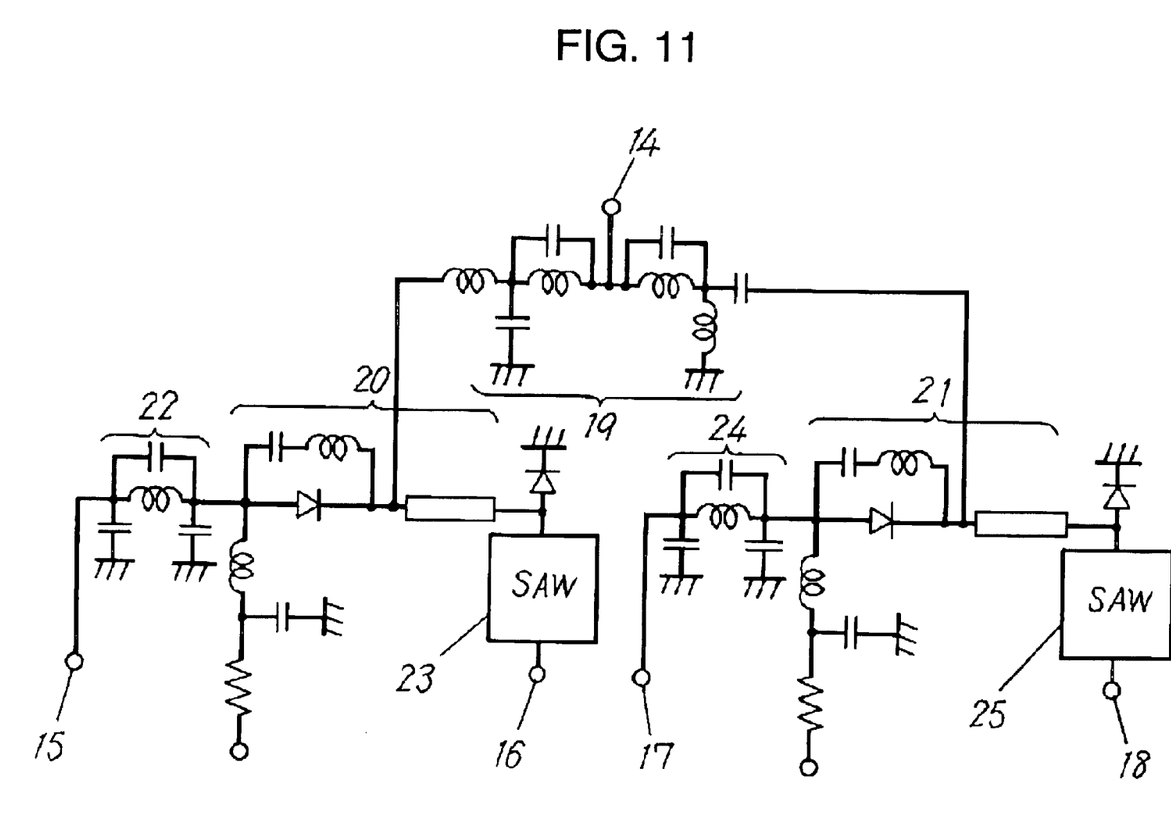
FIG. 11 is a circuit diagram of the high frequency laminated device of Embodiment 3.

A laminated high frequency device according to Exemplary Embodiment 3 of the invention is, for example, an antenna switch duplexer used in an European cellular phone system GSM/DCS. FIG. 9 is a perspective view of the duplexer. FIG. 10 is a circuit block diagram of the duplexer. FIG. 11 is a specific circuit diagram of the duplexer.

As shown in FIG. 9, the antenna duplexer of Embodiment 3 includes a laminated body 11, chip components 12, such as PIN diodes or FET switches, inductors, capacitors, and resistors, and a surface acoustic wave (SAW) filter 13. The laminated body 11 includes magnetic sheets having relative permeabilities larger than 1, and a circuit pattern and a via-conductor formed in the body. As shown in FIG. 10, the device includes an antenna terminal 14, a GSM transmission terminal 15, a GSM reception terminal 16, a DCS transmission terminal 17, a DCS reception terminal 18, a diplexer 19 for separating a GSM signal and a DCS signal, switches 20 and 21, low pass filters (LPFs) 22 and 24, and SAW filters 23 and 25. FIG. 11 shows a circuit including the components in the body. The diplexer 19, a portion of the switches 20 and 21, and LPF 22 and 24 are formed with an LC circuit including inductors and capacitors. Most of the inductors and capacitors are three-dimensionally configured as patterns and via-conductors in the laminated body 11.

The duplexer of Embodiment 3, including the laminated body 11 having the magnetic sheets, increases the isolation between inductor patterns forming inductors similarly to Embodiments 1 and 2, thus providing the duplexer with ideal characteristics. The inductor patterns being relatively short but not thin provides the inductors with large inductances, thus allowing the duplexer to have a small size and a small insertion loss. A high frequency device including many circuit elements like the duplexer of Embodiment 3 includes a lot of inductor patterns and capacitor patterns, that is, a lot of patterns coupled electro-magnetically to each other. The laminated body including different materials, i.e., a dielectric sheet and a magnetic sheet, can include a large capacitor pattern formed at a interface between the materials, thus emphasizing effects of Embodiment 2.

The laminated high frequency device of Embodiment 3 includes the PIN diode, but may have circuit elements, such as an FET switch IC, mounted on a surface of the laminated body 11, thus having the same effects.

The laminated high frequency device of Embodiment 3 includes the SAW filter, but may have a circuit without a SAW filter.

The antenna duplexer for dual bands GSM/DCS as the laminated high frequency device of Embodiment 3 has been described. A duplexer for other complex bands, such as single, triple, and quad bands and a device, such as a low-noise amplifier (LNA) and a mixer, as the device of Embodiment 3 have the same effects.

What is claimed is:

1. A high frequency laminated device comprising:
    a laminated body including
        a first magnetic sheet having a relative permeability larger than 1,
        a second magnetic sheet having a relative permeability larger than 1 over a first surface of said first sheet, and
        a third sheet under said first sheet;
    a first inductor pattern for forming a first inductor and provided between said first and second sheets; and
    first and second capacitor patterns forming a capacitor and situated between said first sheet and said third sheet.

2. The high frequency laminated device of claim 1, wherein said third sheet comprises at least one of a dielectric sheet and a magnetic sheet.

3. The high frequency laminated device of claim 2, wherein said first and third sheets are stacked and sintered after said first capacitor pattern is printed.

4. The high frequency laminated device of claim 1, further comprising a via-conductor formed in said first sheet, for electrically connecting said first inductor pattern and said first capacitor pattern.

5. The high frequency laminated device of claim 1, further comprising a circuit element mounted on a surface of said laminated body and connected to at least one of said first inductor and said capacitor.

6. The high frequency laminated device of claim 1, further comprising a second inductor pattern forming a second inductor provided between said first and second sheets.

* * * * *